(12) United States Patent
Wengert et al.

(10) Patent No.: US 6,325,858 B1
(45) Date of Patent: Dec. 4, 2001

(54) LONG LIFE HIGH TEMPERATURE PROCESS CHAMBER

(75) Inventors: John F. Wengert, Jacksonville, OR (US); Ivo Raaijmakers; Mike Halpin, both of Phoenix, AZ (US); Loren Jacobs, Mesa, AZ (US); Michael J. Meyer, Tempe, AZ (US); Frank van Bilsen, Phoenix, AZ (US); Matt Goodman, Tempe, AZ (US); Eric Barrett; Eric Wood, both of Mesa, AZ (US); Blake Samuels, Scottsdale, AZ (US)

(73) Assignee: ASM America, Inc., Pheonix, AZ (US)

( * ) Notice: Subject to any disclaimer, the term of this patent is extended or adjusted under 35 U.S.C. 154(b) by 0 days.

(21) Appl. No.: 09/184,490

(22) Filed: Nov. 2, 1998

Related U.S. Application Data (60) Provisional application No. 60/064,567, filed on Nov. 3, 1997, and provisional application No. 60/095,139, filed on Jul. 31, 1998.

(51) Int. Cl.[7] .................................................. C23C 16/00
(52) U.S. Cl. ..................... 118/725; 118/715; 118/724; 118/728; 118/730; 136/232
(58) Field of Search ................................. 118/715, 725, 118/728, 730, 724; 136/232

(56) References Cited

U.S. PATENT DOCUMENTS

| | | | |
|---|---|---|---|
| 3,011,006 | * | 11/1961 | Nicholson et al. . |
| 4,377,347 | * | 3/1983 | Hanmyo et al. . |
| 4,592,307 | * | 6/1986 | Jolly . |
| 4,976,996 | * | 12/1990 | Monkowski et al. . |
| 4,978,567 | * | 12/1990 | Miller . |
| 4,984,904 | * | 1/1991 | Nakano et al. . |
| 5,027,748 | * | 7/1991 | Frijlink . |
| 5,065,698 | * | 11/1991 | Kolka . |
| 5,098,198 | * | 3/1992 | Nulman ................................ 374/121 |
| 5,248,500 | * | 9/1993 | Samata et al. . |
| 5,315,092 | * | 5/1994 | Takahashi et al. . |
| 5,336,327 | * | 8/1994 | Leo . |
| 5,360,269 | * | 11/1994 | Ogawa et al. . |
| 5,421,693 | * | 6/1995 | Perlov . |
| 5,456,761 | * | 10/1995 | Auger et al. . |
| 5,474,618 | * | 12/1995 | Allalro . |
| 5,514,439 | * | 5/1996 | Sibley . |
| 5,571,333 | * | 11/1996 | Kahaya . |
| 5,902,407 | * | 5/1999 | DeBoer ................................ 118/725 |

FOREIGN PATENT DOCUMENTS

| | | | |
|---|---|---|---|
| WO 95/31582 | * | 11/1995 | (WO) . |
| WO 97/08288 | * | 2/1997 | (WO) . |

* cited by examiner

*Primary Examiner*—Richard Bueker
(74) *Attorney, Agent, or Firm*—Knobbe, Martens, Olson & Bear, LLP (57) ABSTRACT

A generally horizontally-oriented quartz CVD chamber is disclosed with front and rear chamber divider plates adjacent a centrally positioned susceptor and surrounding temperature control ring which divide the chamber into upper and lower regions. Improvement to the lifetime of CVD process components and related throughput improvements are disclosed. A getter plate for attracting some of the unused reactant gas is positioned downstream from the susceptor extending generally parallel to and spaced between the divider plate and the upper chamber wall. This getter plate also minimizes deposition on the chamber walls and improves the efficiency of a cleaning step. Reradiating elements are also located adjacent side walls of the chamber to heat cooler chamber wall areas. The getter plate and the reradiating elements plus the susceptor and surrounding ring are all made of solid chemical vapor deposited SiC to improve the life of the chamber. Also, thermocouples adjacent the susceptor are provided with SiC sheaths to enable the thermocouples to withstand more process cycles than that of quartz sheaths. SiC shields may be provided on quartz components throughout the chamber to protect the quartz from devitrification. Throughput is improved by both reducing down time and reducing the cleaning step time of the process cycle.

18 Claims, 5 Drawing Sheets

LONG LIFE HIGH TEMPERATURE PROCESS CHAMBER

RELATED APPLICATION

This application claims the priority benefit under 35 U.S.C. §119(e) of Provisional Application No. 60/064,567 filed Nov. 3, 1997 and Ser. No. 60/095,139 filed Jul. 31, 1998.

FIELD OF THE INVENTION

This invention relates to apparatus for the high temperature processing of substrates and, more particularly to chemical vapor deposition (CVD) of materials on semiconductor wafers in a CVD reactor.

BACKGROUND OF THE INVENTION

Generally, in CVD reactors, the material being deposited not only deposits on the wafer, as is desired, but some material, not necessarily the same as that on the wafer, is also deposited on the reactor chamber walls and other parts within the reactor, notably the wafer support and a ring positioned around the wafer support in many reactors. Periodically, in order to maintain a repeatable process, the chamber has to be cleaned. Such chamber cleaning typically occurs by heating the wafer support, chamber walls and other parts to a suitably high temperature and admitting a flow of a halogen containing gas, for example Hcl.

Reactors for epitaxial deposition commonly employ a susceptor and a surrounding ring which helps to control the temperature of the susceptor. These components are usually made from graphite and coated with silicon carbide (SiC). Eventually, the Hcl etch will penetrate the SiC coating which will cause rapid deterioration of the properties of the deposited films. Hence, they must be replaced. One type of well-known reactor employs thermocouples adjacent the ring for sensing the temperature of the rings surrounding the susceptor, which in turn is an indirect measure of the temperature of the susceptor and a wafer positioned on it. These thermocouples are usually sheathed with quartz. Frequent thermal cycling of the quartz to temperatures in excess of 1000° C. causes devitrification of the quartz sheath and failure of the thermocouples, thus requiring replacement.

Commonly, the chamber is formed of quartz. A problem in high temperature chemical vapor deposition operations is that reactant gases may coat the interior of quartz chamber walls. Coatings on the chamber walls can have a number of undesirable aspects including the flaking of particles off the walls and the need for more frequent cleaning of the chamber. Some of the material depositing on the quartz chamber walls may not be etched away when the chamber is cleaned. If sufficient deposits gather, the quartz chamber locally loses its transparency and will heat rapidly by radiation from the lamps conventionally positioned adjacent the exterior of an upper chamber wall and adjacent the exterior of a lower chamber wall. This eventually requires the need to wet clean or even to replace the quartz chamber.

If the chamber walls become too hot, the reactant gases can deposit on the walls in similar fashion to depositing on a wafer. Quartz is the material of choice for chamber walls because quartz is to a large extent transparent to the heat energy provided by the lamps. As the wafer, the susceptor and the surrounding compensation ring are heated by this radiant energy, they reradiate energy back towards the chamber walls. Some of this reradiated energy has a wave length at which a significant portion of the energy is absorbed by the quartz chamber walls. Consequently, to maintain the temperature of the walls below that at which deposition on the walls will occur, it is customary to flow air or other coolant across the lamps and adjacent chamber walls. This cooling, however, can cause some sections of the chamber walls to be maintained at temperatures at which reactant gases can condense on those cooler areas. Other chamber components, such as a spider used to support the susceptor and a stand used to support the ring, are also commonly made of quartz and are therefore subject to the same problems of devitrification and exposure to processing gases.

The need to replace susceptors, rings, thermocouples, chambers and various other chamber components naturally results in down-time for the reactor and significant costs for replacement components. In addition, there is significant time and expense in returning the reactor to the condition to provide the desired film properties on the wafers being coated.

It is an object of this invention to significantly extend the life of the components within the CVD chamber. It is a further object of this invention to decrease the amount of deposits on the chamber walls and some components in the CVD chamber to extend their life. It is also an object to increase the cleaning efficiency of the cleaning agent. Related to the last two objects, it is a further object of this invention to reduce down time and hence increase throughput.

SUMMARY OF THE INVENTION

In accordance with the invention, there is provided a chemical vapor deposition reactor for the processing of semiconductor wafers wherein the life of the chamber and of all the internal components is extended and matched to the life of the process chamber by proper choice of infrared absorbing and nonabsorbing parts/materials. In one arrangement, the chamber is in the form of a horizontally oriented quartz tube divided into an upper region and a lower region by a front divider plate, a susceptor surrounded by a temperature compensation or slip ring, and a rear divider plate. In the upper region, the flow of reactants is introduced to cause the growth of silicon or other material on a wafer positioned on the susceptor. In the lower region of the reactor, a purge gas is introduced to keep the reactive gases from diffusing or flowing into the bottom part of the reactor.

To minimize the deposition of unused reactant gases on the chamber walls downstream from the susceptor, surfaces are positioned in the gas stream to cause some of the unused reactants to deposit on them rather than on the adjacent chamber walls. The surfaces are made of infrared light absorbing material that can withstand high temperatures, such as silicon carbide. In one arrangement, the surfaces are on a plate that extends generally parallel to the gas flow and is spaced between the rear chamber divider plate and the upper wall of the chamber so that both the upper and lower surfaces of this so-called getter plate are exposed to the unused reaction gases. Also, the plate reradiates energy in a broader spectrum including wave lengths more readily absorbed by the quartz walls. Positioning the plate close to the upper chamber wall maximizes that effect. By properly controlling the temperature, this arrangement minimizes the deposition or condensation on the cooler, adjacent quartz chamber wall, and improves the cleaning of the wall too, thereby extending the life of the chamber.

Another technique for minimizing deposition on quartz chamber walls in this manner is to position a shield or heat absorber adjacent the chamber of walls that tend to be to cool or otherwise tend to receive the most deposition or condensation. This can vary for differing chamber configurations. For example, in some chambers, walls surrounding a susceptor may benefit from the use of such shields. In addition to lengthening the life of the chamber, such shields can minimize particle problems due to the flaking of deposition coating. Further, doping of subsequent wafers as a result of leftover dopant in the deposit on the chamber is also minimized. Blockage of the radiant heat through the chamber walls surrounding the susceptor restricts cooling on the edges of the chamber.

Mounted adjacent the susceptor are one or more thermocouples having an external sheath more durable than quartz, such as silicon carbide. Silicon carbide does not devitrify or wear out upon high temperature cycling and, thus, the life of the thermocouple sheath is greatly extended over that of previously used quartz sheaths. Because silicon carbide might react unfavorably with the thermocouple, a thin quartz or other nonreacting material sleeve is positioned over the thermocouple junction within the silicon carbide sheath.

Silicon carbide shields are provided throughout the chamber to protect quartz reactor components from devitrification. In one embodiment, a silicon carbide cap is provided over a quartz sheath covering a central thermocouple, thereby protecting the quartz from the processing gases. Silicon carbide shields may also be used to cover, either partially or fully, other quartz components, such as the quartz spider supporting the susceptor or the quartz stand supporting the slip ring.

The susceptor and the ring surrounding the susceptor are both made of a material such as solid silicon carbide rather than silicon carbide coated graphite. The life of solid CVD silicon carbide components is about five times that of silicon carbon coated graphite components. This extended life is about the same as the life of the reactor chamber employing the getter plate as described above. It is expected that the silicon carbide sheathed thermocouples and quartz components shielded with silicon carbide will last for a similar period of time. As a result, it is believed that the above improvements in the lifetime of the internal reactor components and the quartz chamber can improve the maintenance frequency on the reactor from about 1,500 to 4,000 wafers to more than 20,000.

DETAILED DESCRIPTION OF THE PREFERRED EMBODIMENT

Figure 1:
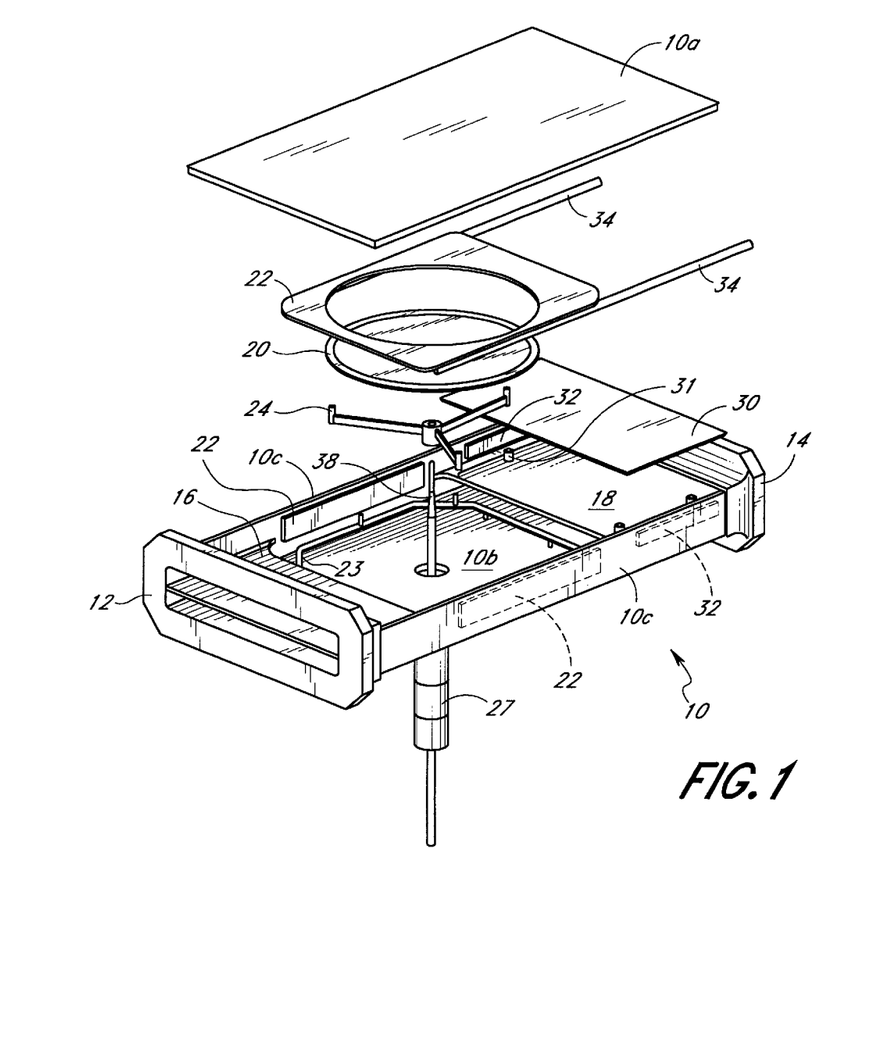
FIG. 1 is an exploded perspective view of the improved chamber of the invention together with its improved internal components.
Figure 2:
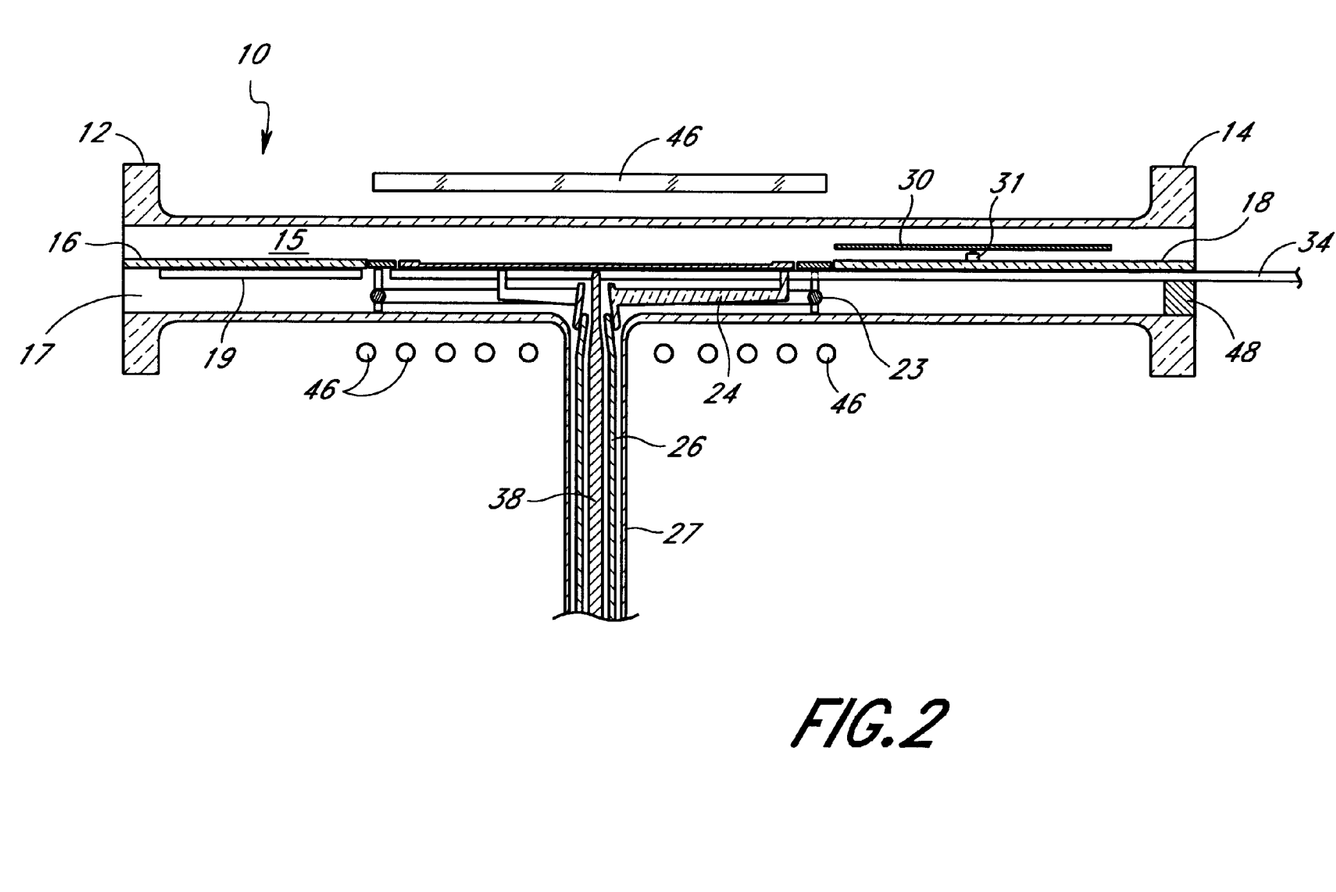
FIG. 2 is a cross-sectional view of the chamber of FIG. 1.

Referring to FIGS. to 1 and 2, there is illustrated an elongated generally flat rectangular chamber 10 made of quartz. The chamber includes a flat upper wall 10a, a flat lower wall 10b joined by a pair of short vertical side walls 10c. A thickened inlet flange 12 extends across the gas inlet end of the chamber attached to the chamber walls. A similar gas outlet flange 14 is shown on the downstream end of the chamber attached to the chamber walls.

The chamber is divided into an upper section 15 and a lower section 17 by a flat front or upstream divider plate 16 and a rear, downstream plate 18 extending between the chamber side walls 10c, generally parallel to the upper and lower walls. The divider plates 16 and 18 are supported by supports 19 formed on the side walls 10c, or by supports (not shown) extending upwardly from the chamber bottom wall. The rear chamber divider plate is in approximately the same plane as the front plate. The chamber is further divided by a generally flat circular susceptor 20 and a surrounding ring 22, sometimes referred to as a temperature compensation ring or a slip ring (to prevent crystallographic slip). For best results, the thermal mass per unit irradiated area of the slip ring should be similar to that of the susceptor. Depending on the particular configuration, the optimum slip ring and thermal mass may be somewhat larger or smaller than that of the susceptor. Experimentation is suitable to identify the optimum. The susceptor and the slip ring are also positioned in substantially the same plane as the divider plates 18 and 16, as best seen in the cross-sectional view of FIG. 2.

The susceptor 20 is supported by a spider 24 having three arms extending radially outwardly from a central hub and having upwardly extending projections on the ends of the arms engaging the susceptor. The susceptor may also be provided with one or more recesses (not shown) on its lower surface for receiving the ends of the projections so as to centrally position the susceptor and to form a coupling for rotating the susceptor. The spider is mounted on a schematically shown tubular shaft 26 which extends through the chamber lower wall 10b and also extends through a quartz tube 27 attached to and depending from the lower chamber wall. The shaft is adapted to be connected to a drive (not shown) for rotating the shaft, the spider and the susceptor. Details of one such an arrangement together with a drive mechanism may be seen in U.S. Pat. No. 4,821,674 which is incorporated by reference. The ring 22 is shown supported by a stand 23 resting on the lower chamber wall 10b. Alternatively, the ring may be supported on ledges extending inwardly from the chamber side walls or on ledges extending from the divider plates 16 and 18.

Positioned downstream from the susceptor and the ring is a getter plate 30 supported on a plurality of pins 31 extending upwardly from the rear chamber divider plate 18. The getter plate extends generally parallel to and approximately mid-way between the upper chamber wall 10a and the divider plate. One or more of these plates could be used. The plate can be shaped to tailor the gas flow dynamics of the system. Acceptable results have been obtained with a single flat plate. However, to someone skilled in the art, the optimization of the shape of the plate is straight forward. Also optionally positioned downstream from the susceptor are shields or heat absorbers 32 positioned on each side of the getter plate and adjacent downstream portions of the side walls 10c. In addition, shields or heat absorbers 33 may be employed on each side of the central area of the chamber adjacent the central portions of the side walls 10c. The elements 33 may not be needed because the silicon carbide ring 22 adjacent the chamber walls has considerable heating effect on these adjacent chamber walls. These elements 32 and 33 may be held in position by any suitable means. For example, the elements 32 might be positioned by the pins 31, and spaced slightly from the chamber side walls 10c. If desired, projections may be mounted on the chamber side walls and on the downstream plate 18 to position the elements 32 slightly spaced from the side walls. Similarly, the elements 33 may rest on supports on the chamber lower wall 10b between the chamber side walls 10c and the stand 23 positioned by suitable supports mounted on the side walls to space the upper end of the element 33 slightly from the side walls.

The elements 32 and 33 are preferably made of silicon carbide, or graphite coated with silicon carbide, or other suitable heat-absorbing material. The purpose of the elements 32 and 33 is to absorb some heat to minimize the deposition of materials on the chamber walls. Reduced deposition means reduced particle problems due to flaking of coatings on the chamber wall. Further, doping of wafers as the result of leftover dopant and deposits on the chamber is minimized. Also, blockages of radiant heat affecting wafer temperature directly by way of a temperature control loop are also minimized.

While the elements 32 and 33 are illustrated as thin plates that are somewhat co-extensive with the adjacent side walls, other configurations may be employed. For example, thicker but vertically shorter elements could be employed in that the elements are primarily heat absorbers and then reradiators of heat to the side walls thus minimize cooling in the chamber edges. Thus, the shorter, thicker portions would also tend to increase the temperature of the adjacent chamber walls even though they are not co-extensive with the wall.

Figure 7A:
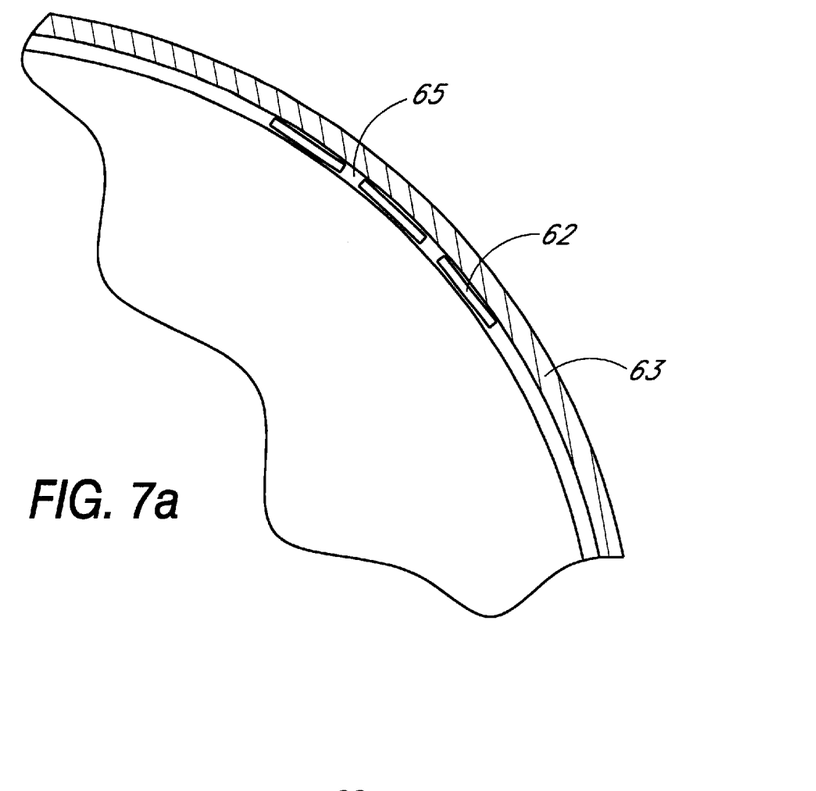
FIGS. 7a–b are schematic views of the interior of a generally circular chamber with heat absorbers adjacent the chamber walls surrounding the susceptor.
Figure 7B:
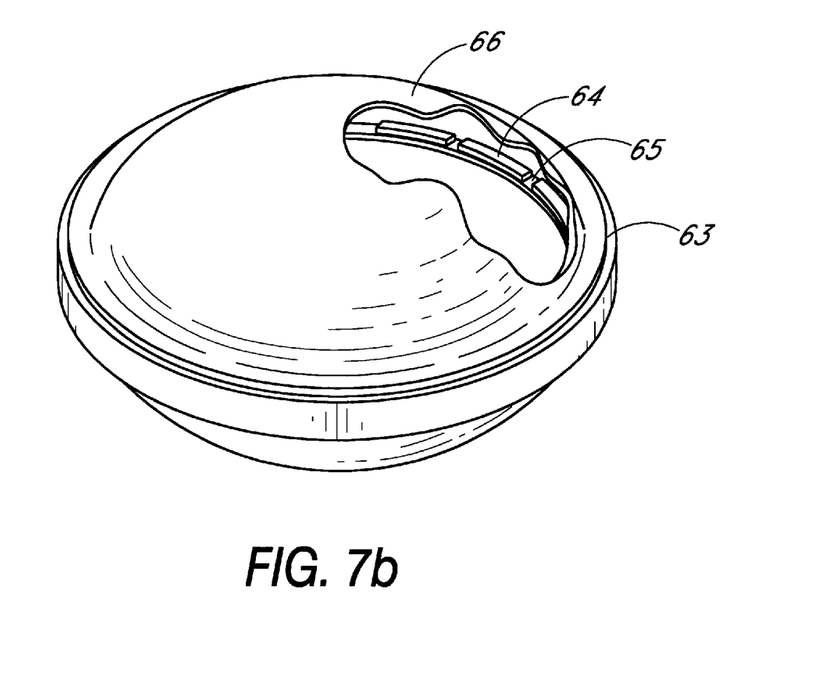

FIG. 7a schematically illustrates a series of silicon carbide pieces 62 adjacent the side wall 63 of a CVD chamber having a generally circular configuration. A series of short, straight pieces 62 are illustrated, but of course longer curved portions 64 can be utilized such as in FIG. 7b. These pieces 62 are supported in a suitable manner adjacent to the side chamber wall such as on suitable quartz pins (not shown) supported on a quartz chamber flange 65. FIG. 7b schematically illustrates a chamber having a dome shaped upper wall 66.

A cleaner chamber of course leads to better process results for the reasons mentioned above. Further, a cleaner chamber does not have to be pulled as frequently thus less downtime, and a chamber which has to be cleaned less frequently will last longer because of the reduced wear caused by the cleaning process.

Figure 3:
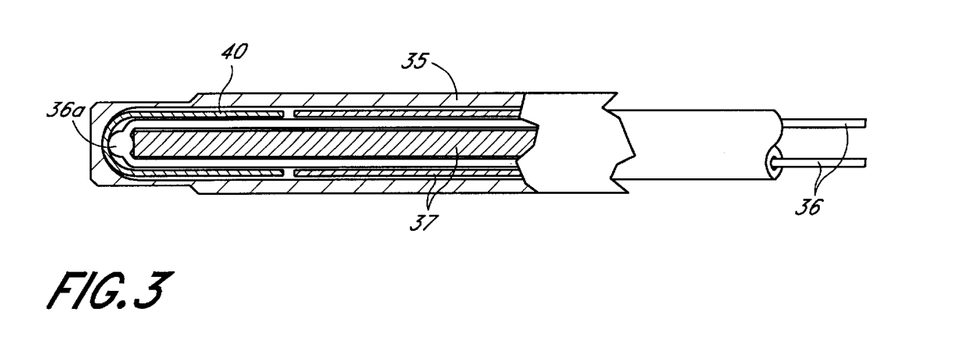
FIG. 3 is an enlarged cross-sectional view of the thermocouples seen in FIG. 1.
Figure 4:
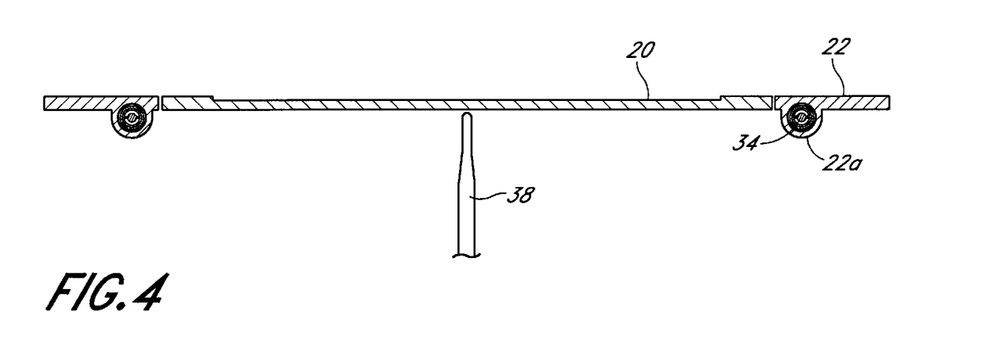
FIG. 4 is a cross-sectional view showing the thermocouple support and the thinness of the susceptor and ring.

A pair of thermocouples 34 are shown on opposite sides of the ring 22, with the thermocouples extending generally parallel to the chamber side walls 10c. The thermocouples are positioned beneath and supported by the ring 22, as best seen in FIG. 4, which shows each thermocouple extending through a tubular portion 22a of the ring. One may also position the thermocouples in close proximity to the slip ring, depending on the allowable temperature reading error. Referring to FIG. 3, each thermocouple 34 includes an outer sheath 35 surrounding a ceramic support 37 that has a pair of thermocouple wires 36 extending therethrough and forming a junction 36a. Additionally, a small quartz sleeve or cap 40 extends over the thermocouple junction 36a to shield it from the sheath, in the event the sheath is not chemically compatible with the thermocouple wires. Alternatively, a boron nitride coating can be used on the wires.

Preferably a thermocouple junction 36a is located at each of the forward or upstream corners of the ring 22. Also, it is desirable that one or two additional thermocouple junctions be positioned in each sheath 35, with the junction of a second pair of wires being located adjacent the rear or downstream corners of the ring 22. Also, a junction could be located between the upstream and downstream corners. In addition, a similar thermocouple 38 is shown extending upwardly through the tubular shaft 26, with its tip located close to the center of the susceptor 20.

Figure 5:
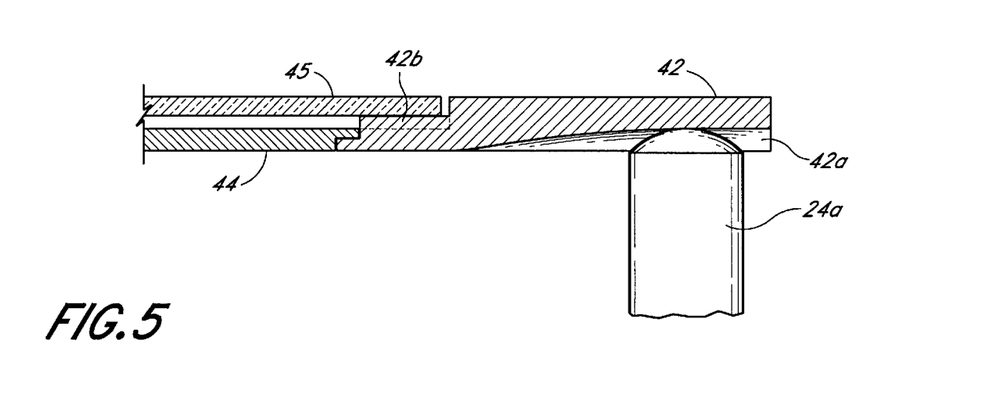
FIG. 5 is a fragmentary, cross-sectional view of another form of wafer support.

Both the susceptor and the surrounding ring are formed to have a very low thermal mass. Preferably, the susceptor has mass comparable to that of a semiconductor wafer which it is to support, say within a factor of three. The susceptor may be formed as one piece as shown in FIG. 4 or as two pieces as shown in FIG. 5. This includes an outer support ring 42 having a lower inwardly extending flange supporting a central flat disc 44. The ring further includes an edge having three to six raised lips 42b for supporting a wafer 45 that fits within the ring 42. The lips space the wafer from the disc 44. The end of one spider arm projection 24a is shown positioned in a groove 42a in the lower surface of the ring 42.

In accordance with the invention, the susceptor, the ring and the getter plate are all made from a material which can withstand the CVD processing as well or better than that of SiC coated graphite. The thermocouple sheaths are made from a material which does not devitrify. The material should be a good absorber of radiant energy from the susceptor and the heating lamps 46, schematically illustrated in FIG. 2. Further, the material must be a reasonably good thermal conductor and be able to withstand the high temperatures encountered in CVD processing over a large number of cycles. This also includes the ability to withstand the thermal shock that repeatedly occurs with the placing of a relatively cold wafer on a hot susceptor. In addition, the material must be durable and compatible with the various materials employed in the deposition process, as well as, the various chemicals employed in cleaning or etching, and it must have excellent chemical stability. The prime material meeting those qualifications in chemistries typically used for Si or Si-Ge epitaxy is silicon carbide. Thus, the susceptor and its surrounding ring are preferably made of solid silicon carbide as opposed to the prior art approach of using graphite coated with silicon carbide. Further, the ring and the susceptor as well as the getter plate and the thermocouple sheaths are preferably formed of CVD silicon carbide. This enables the susceptor and the ring to be used through many more heating cycles than the previously used silicon carbide coated graphite components. Since the temperature downstream of the susceptor is less than on the susceptor, the getter device may last longer than the other elements of the system. The silicon carbide thermocouple sheath can withstand many more cycles than the previously used quartz sheaths.

The life of the reactor components is also improved by providing shields of silicon carbide at specific locations throughout the chamber. Deposition of material on quartz pieces (like Si) can lead to premature failure of the quartz. Shielding critical areas with SiC prevents deterioration of the quartz, thereby extending the life of the process chamber. It will be appreciated that silicon carbide shields may be provided wherever quartz is found in the chamber, such as the spider 24, the stand 23, thermocouples 34 and 38, and any other suitable locations, so long as the silicon carbide does not substantially interfere with the operation of the chamber.

Figure 6:
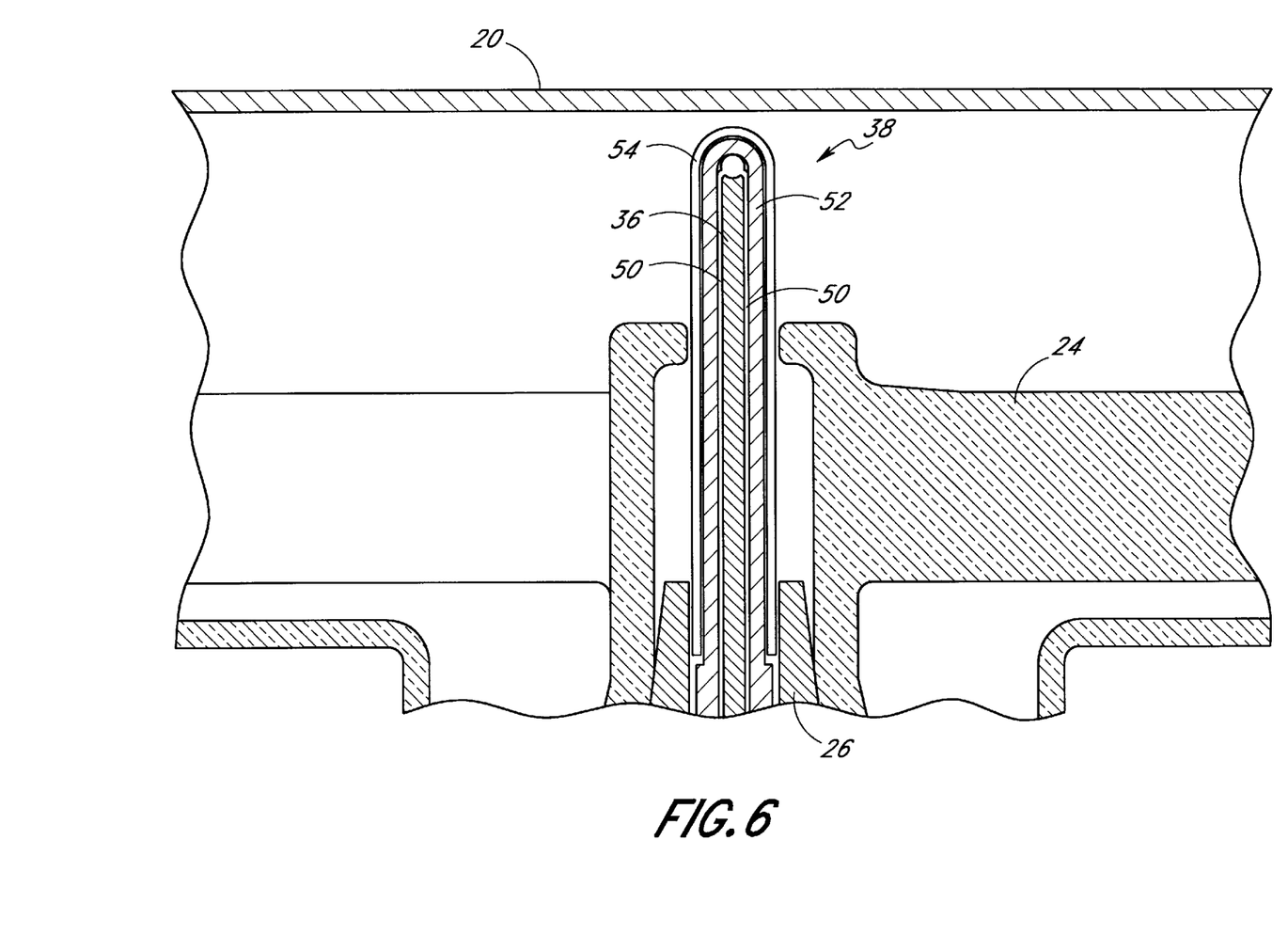
FIG. 6 is a cross-sectional view of a central thermocouple having a silicon carbide cap.

Referring to FIG. 6, one embodiment for protecting quartz components with a silicon carbide shield is shown with reference to the central thermocouple 38. The thermocouple 38 comprises thermocouple wires 50 surrounded by a quartz sheath 52. A silicon carbide cap 54 is provided over the quartz sheath 52 to protect the thermocouple 38 from processing gases that tend to deposit on the tip of thermocouple, and to insulate the quartz sheath from the effects of the etch process which is used to remove the process gas deposits.

Silicon carbide shields such as the cap 54 shown in FIG. 6 are preferably formed from a simple geometric construction adapted to fit over the corresponding quartz component to isolate the component either partially or fully from the processing gases of the chamber. Because silicon carbide components are generally relatively expensive and difficult to form into complex shapes, the use of simple geometries, such as caps, flat plates, L-shapes, U-shapes, T-shapes and various other planar, curved and curviplanar shapes, minimizes the cost of manufacture and simplifies the overall manufacturing process. This further enables the complex components of the chamber to be formed from quartz, which is relatively inexpensive and easy to machine and weld. Thus, in the chamber 10 illustrated in the preferred embodiment of FIGS. 1 and 2, components such as the thermocouples 34 and 38, the spider 24 and the stand 23 are preferably manufactured using quartz and are then capped with a simply constructed silicon carbide shield.

In addition to silicon carbide, other materials that may be satisfactory are boron nitride, silicon nitride, silicon dioxide, aluminum nitride, aluminum oxide, combinations or ternary compounds or quaternary compounds of these materials, pyrolytic graphite and other similar high temperature ceramic compounds. The silicon carbide components may be made by a combination of CVD of SiC and material removal techniques. Examples of such techniques are discussed in U.S. Pat. Nos. 4,978,567 and 5,514,439 incorporated herein by reference.

Operation

In operation, two gas flows are introduced into the reactor. In the upper part, the flow of reactants is introduced through the inlet flange 12 to cause the growth of silicon or other material on a wafer positioned within a central recess in the upper surface of the susceptor. In the bottom part of the reactor, a purge gas is introduced through the inlet flange to keep reactant gases or cleaning gas from flowing into the bottom part of the reactor through the small gaps between the ring and the divider plates and between the susceptor and the ring. The downstream end of the lower chamber region is blocked by a plug or wall 48 so that the purge gas is forced to leak through the gaps to the upper chamber outlet, thereby minimizing the possibility of gas from the upper chamber flowing into the lower one.

Unused reactants flowing downstream from the susceptor and ring are deposited on both sides of the getter plate of FIG. 1, thereby minimizing deposition on the upper quartz wall of the reactor. The getter plate, in addition to receiving deposition itself, reradiates energy towards the cooler upper chamber wall, including energy in a wave length range in which a significant portion will be absorbed by the quartz wall. The pieces positioned against the side wall work in similar fashion. It should be noted that it is important to position those elements close to the surface desired to be heated to maximize the radiation being absorbed.

Likewise, in the arrangements of FIG. 7, the silicon carbide pieces are located so as to heat the surrounding side chamber wall and the peripheral portion of the upper dome wall 66. In a dome-type chamber, gas flow can be downwardly from the center of an upper chamber wall or can be horizontally across the chamber. In the latter situation, a horizontally wide but vertically short slot (not shown) is formed in the side wall of the chamber, and there would be no need or desire to have the silicon carbide pieces in that area, but they are desirable around the remainder of the periphery of the chamber side wall including adjacent a gas outlet slot (not shown). Maintaining the chamber warm during a chamber cleaning cycle also maximizes the etch efficiency of a cleaning agent, such as Hcl.

As a result of the foregoing techniques, the life of the process chamber is significantly extended, estimated to increase from about 10,000 wafers to more than about 20,000 wafers. Further, by protecting the components in the lower portion of the chamber, the quartz spider and the quartz stand for the ring also have extended life and need not be replaced any more frequently than the chamber itself. Further, it is possible that silicon carbide or other mentioned materials could be used for those components.

As noted, the susceptor, surrounding ring and the thermocouple sheaths are also manufactured from solid silicon carbide, like the downstream getter plate. Solid silicon carbide is not appreciably attacked by an Hcl chamber etch at high temperatures. The life of solid silicon carbide components is estimated to be about 20,000 wafers which is about five times that of silicon carbide coated graphite components (about 3,000 to 4,000 wafers). This balances the life of the light absorbing susceptor and ring with that of the reactor chamber. Further, it is anticipated that the thermocouple sheaths will last approximately that long, or longer. Consequently, the improvements in lifetime of the internal reactor components and quartz chamber can improve the maintenance frequency on the reactor from a maximum of about 1,500 to 4,000 wafers to about 20,000 wafers.

Longer life of the reactor components and process chamber, or course, results in lower consumable costs. Likewise, longer intervals for preventive maintenance result in less down time and less reactor tuning. Less reactor tuning also results in lower use of monitor wafers. Thus, it can be seen that this integrated chamber system provides very significant benefits.

While the invention has been described in connection with a particular chamber and related components, the invention also applies to other chamber shapes and components.

What is claimed is:

1. A chemical vapor deposition apparatus for the processing of substrates such as semiconductor wafers comprising:

a process chamber having quartz walls and having an inlet for receiving deposition gases;

a solid silicon carbide susceptor positioned in the chamber to receive a wafer;

a silicon carbide ring closely surrounding the susceptor; and a silicon carbide getter plate positioned downstream from the susceptor and the ring to receive deposition of unused reactant gas, and including one or more elements positioned in said chamber adjacent chamber side walls to absorb radiant energy from heating lamps which is transmitted into said chamber through said quartz walls and to reradiate energy to heat said adjacent chamber walls to minimize the coating of said deposition gases on said adjacent chamber walls, wherein said elements are located adjacent the chamber walls on opposite sides of said getter plate.

2. The apparatus of claim 1 including a silicon carbide sheathed thermocouple extending adjacent the susceptor to monitor susceptor temperature.

3. The apparatus of claim 2, wherein said thermocouple extends generally straight.

4. The apparatus of claim 3, wherein a silicon carbon sheathed thermocouple is positioned on opposite sides of the susceptor and each extend towards the downstream end of the chamber.

5. The apparatus of claim 1, including a tubular shaft supporting said susceptor and a thermocouple extending upwardly through said shaft and terminating sufficiently close to the susceptor to provide input regarding the temperature of the susceptor in that location.

6. The apparatus of claim 1, including a divider plate extending upstream from the ring in the approximate plane of the ring and the susceptor;

a divider plate downstream from the susceptor and ring extending across the chamber and generally in the plane of the susceptor and ring, said chamber being divided into an upper section and a lower section by the divider plates, the ring and the susceptor.

7. The apparatus of claim 6, including a reactant gas inlet in said chamber opening into said upper section, and a purge gas inlet opening into said lower sections.

8. The apparatus of claim 7, including a gas outlet from said upper section and means blocking a downstream end of said lower section so that purge gas is forced to exit upwardly through gaps between components into the upper sections.

9. The apparatus of claim 1, wherein a central thermocouple disposed below the susceptor comprises a quartz sheath covered by a silicon carbide cap.

10. The apparatus of claim 1, wherein said elements are made of silicon carbide.

11. A chemical vapor deposition apparatus for the processing of substrates such as semiconductor wafers comprising:

a process chamber having quartz walls;

a susceptor in said chamber for receiving a wafer;

a ring closely surrounding the susceptor;

a quartz chamber divider plate extending upstream from the ring in the approximate plane of the ring in the susceptor;

a quartz plate downstream from the susceptor and ring extending across the chamber and generally in the plane of the susceptor and ring, said chamber being divided into an upper section and a lower section by the divider plates the ring and the susceptor;

a getter plate positioned downstream from the susceptor and the ring extending generally parallel to and spaced above the downstream divider plate; and a thermocouple extending adjacent the susceptor to monitor susceptor temperature;

said susceptor, said ring, said getter plate and an outer sheath of said thermocouple being formed of silicon carbide.

12. A chemical vapor deposition apparatus, comprising a thermocouple for use in a chemical vapor deposition process chamber, said thermocouple including thermocouple wires; a quartz sheath surrounding the wires; and a silicon carbide cap exposed over the quartz sheath.

13. A chemical vapor deposition apparatus comprising:

a reaction chamber having a reactant gas inlet;

a generally planar susceptor in the chamber for supporting a semiconductor wafer; and a silicon carbide getter plate positioned downstream from the susceptor, the plate being generally parallel to the susceptor in a plane spaced above the plane of the susceptor and spaced below an adjacent quartz chamber wall so that unused reactant gases flow adjacent both sides of the plate to cause unused reactants to deposit on the plate rather than on the adjacent chamber wall.

14. The apparatus of claim 13, wherein the chamber is generally horizontally oriented and includes a forward plate upstream from the susceptor and a divides plate downstream of the susceptor dividing the chamber into upper and lower sections, and said getter plate is spaced above said divider plate.

15. The apparatus of claim 13, including one or more elements positioned adjacent side walls of said chamber, said elements being made of material which is a better heat absorber than the side walls of the chamber.

16. The apparatus of claim 15, wherein said elements are positioned adjacent chamber walls on opposite sides of said getter plate.

17. The apparatus of claim 15, wherein said elements are made of silicon carbide.

18. A thermocouple for a chemical vapor deposition process chamber, comprising:

thermocouple wires;

a quartz sheath surrounding the wires; and a silicon carbide cap disposed over the quartz sheath.

* * * * *